United States Patent [19]

Nyuji et al.

[11] 4,352,162
[45] Sep. 28, 1982

[54] DIGITAL FILTER

[75] Inventors: Tomoaki Nyuji, Hirakata; Itaru Kawasaki, Minoo; Masahiro Noguchi, Hirakata; Masahide Tsukamoto, Neyagawa, all of Japan

[73] Assignee: Matsushita Electric Industrial Co., Ltd., Osaka, Japan

[21] Appl. No.: 162,614

[22] Filed: Jun. 24, 1980

[30] Foreign Application Priority Data

Jun. 25, 1979 [JP] Japan .................................. 54-80603
Jan. 18, 1980 [JP] Japan .................................. 55-4855

[51] Int. Cl.³ .......................... G06F 15/34; G10L 1/00
[52] U.S. Cl. ................................. 364/724; 179/1 SA; 179/1 SM
[58] Field of Search .......... 364/724; 179/1 SA, 1 SG, 179/1 SM

[56] References Cited

U.S. PATENT DOCUMENTS

| 3,908,085 | 9/1975 | Gagnon ............................. 179/1 SG |
| 4,022,974 | 5/1977 | Kohut et al. ...................... 179/1 SM |
| 4,058,676 | 11/1977 | Wilkes et al. ..................... 179/1 SA |
| 4,209,844 | 6/1980 | Brantingham et al. ............. 364/724 |

Primary Examiner—Jerry Smith
Attorney, Agent, or Firm—Wenderoth, Lind & Ponack

[57] ABSTRACT

A digital filter for a voice synthesis circuit which operates on the basis of the principle of linear predictive coding. More particularly, a digital filter of the lattice type for voice synthesis on the basis of the principle of linear predictive coding and capable of operating with a low clock frequency. Furthermore, the digital filter may use one multiplication circuit and one addition/subtraction circuit as well as containing an attenuation term element.

6 Claims, 15 Drawing Figures

| Cycle | Input to 102 a | Input to 102 b | Output of 103 | Output of 104 | Input C to 106 | d-c/d+c | Input d to 106 | Output of 106 | Input to 108 | Output of 108 | Output of 109 | Output of 110 |
|---|---|---|---|---|---|---|---|---|---|---|---|---|
| T1 | $k_2$ | $b_2(i-1)$ | $k_9b_9(i-1)$ | $k_{10}b_{10}(i-1)$ | $k_{10}b_{10}(i-1)$ | — | $AU(i)$ | $AU(i)$ | $Y_1(i-1)$ | $b_2(i-1)$ | $Y_1(i-1)$ | $Y_1(i-2)$ |
| T2 | $k_1$ | $b_1(i-1)$ | $k_8b_8(i-1)$ | $k_9b_9(i-1)$ | $k_9b_9(i-1)$ | — | $Y_{10}(i)$ | $Y_{10}(i)$ | $U(i+1)$ | $Y_1(i-1)$ | $b_{10}(i-1)$ | $Y_1(i-1)$ |
| T3 | A | $U(i+1)$ | $k_7b_7(i-1)$ | $k_8b_8(i-1)$ | $k_8b_8(i-1)$ | — | $Y_9(i)$ | $Y_9(i)$ | $Y_9(i)$ | $U(i+1)$ | $b_9(i-1)$ | |
| T4 | $k_9$ | $Y_9(i)$ | $k_6b_6(i-1)$ | $k_7b_7(i-1)$ | $k_7b_7(i-1)$ | — | $Y_8(i)$ | $Y_8(i)$ | $Y_8(i)$ | $Y_9(i)$ | | |
| T5 | $k_8$ | $Y_8(i)$ | $k_5b_5(i-1)$ | $k_6b_6(i-1)$ | $k_6b_6(i-1)$ | — | $Y_7(i)$ | $Y_7(i)$ | $Y_7(i)$ | $Y_8(i)$ | | |
| T6 | $k_7$ | $Y_7(i)$ | $k_4b_4(i-1)$ | $k_5b_5(i-1)$ | $k_5b_5(i-1)$ | — | $Y_6(i)$ | $Y_6(i)$ | $Y_6(i)$ | $Y_7(i)$ | | |
| T7 | $k_6$ | $Y_6(i)$ | $k_3b_3(i-1)$ | $k_4b_4(i-1)$ | $k_4b_4(i-1)$ | — | $Y_5(i)$ | $Y_5(i)$ | $Y_5(i)$ | $Y_6(i)$ | | |
| T8 | $k_5$ | $Y_5(i)$ | $k_2b_2(i-1)$ | $k_3b_3(i-1)$ | $k_3b_3(i-1)$ | — | $Y_4(i)$ | $Y_4(i)$ | $Y_4(i)$ | $Y_5(i)$ | | |
| T9 | $k_4$ | $Y_4(i)$ | $k_1b_1(i-1)$ | $k_2b_2(i-1)$ | $k_2b_2(i-1)$ | — | $Y_3(i)$ | $Y_3(i)$ | $Y_3(i)$ | $Y_4(i)$ | | |
| T10 | $k_3$ | $Y_3(i)$ | $AU(i+1)$ | $k_1b_1(i-1)$ | $k_1b_1(i-1)$ | — | $Y_2(i)$ | $Y_2(i)$ | $Y_2(i)$ | $Y_3(i)$ | | |

Fig. 3B

| Cycle | Input to 102 (a) | Input to 102 (b) | Output of 103 | Output of 104 | Input C to 106 | d-c / d+c | Input d to 106 | Output of 106 | Input to 108 | Output of 108 | Output of 109 | Output of 110 |
|---|---|---|---|---|---|---|---|---|---|---|---|---|
| T11 | $k_2$ | $Y_2(i)$ | $k_9 Y_9(i)$ | $AU(i+1)$ | $k_9 Y_9(i)$ | + | $b_9(i-1)$ | $Y_1(i)$ | $Y_1(i)$ | $Y_2(i)$ | $b_9(i-1)$ | $Y_1(i-1)$ |
| T12 | $k_1$ | $Y_1(i)$ | $k_8 Y_8(i)$ |   | $k_8 Y_8(i)$ | + | $b_8(i-1)$ | $b_{10}(i)$ | $b_{10}(i)$ | $b_{10}(i)Y_1(i)$ | $b_8(i-1)$ |   |
| T13 | $k_{10}$ | $b_{10}(i)$ | $k_7 Y_7(i)$ |   | $k_7 Y_7(i)$ | + | $b_7(i-1)$ | $b_9(i)$ | $b_9(i)$ | $b_9(i)$ | $b_7(i-1)$ |   |
| T14 | $k_9$ | $b_9(i)$ | $k_6 Y_6(i)$ |   | $k_6 Y_6(i)$ | + | $b_6(i-1)$ | $b_8(i)$ | $b_8(i)$ | $b_8(i)$ | $b_6(i-1)$ |   |
| T15 | $k_8$ | $b_8(i)$ | $k_5 Y_5(i)$ |   | $k_5 Y_5(i)$ | + | $b_5(i-1)$ | $b_7(i)$ | $b_7(i)$ | $b_7(i)$ | $b_5(i-1)$ |   |
| T16 | $k_7$ | $b_7(i)$ | $k_4 Y_4(i)$ |   | $k_4 Y_4(i)$ | + | $b_4(i-1)$ | $b_6(i)$ | $b_6(i)$ | $b_6(i)$ | $b_4(i-1)$ |   |
| T17 | $k_6$ | $b_6(i)$ | $k_3 Y_3(i)$ |   | $k_3 Y_3(i)$ | + | $b_3(i-1)$ | $b_5(i)$ | $b_5(i)$ | $b_5(i)$ | $b_3(i-1)$ |   |
| T18 | $k_5$ | $b_5(i)$ | $k_2 Y_2(i)$ |   | $k_2 Y_2(i)$ | + | $b_2(i-1)$ | $b_4(i)$ | $b_4(i)$ | $b_4(i)$ | $b_2(i-1)$ |   |
| T19 | $k_4$ | $b_4(i)$ | $k_1 Y_1(i)$ |   | $k_1 Y_1(i)$ | + | $b_1(i-1)$ | $b_3(i)$ | $b_3(i)$ | $b_3(i)$ | $b_1(i-1)$ |   |
| T20 | $k_3$ | $b_3(i)$ | $k_{10} b_{10}(i)$ | → | $AU(i+1)$ | + | 0 | $b_2(i)$ | $b_2(i)$ | $b_3(i)$ | $Y_2(i)$ | $Y_1(i-1)$ |

| Cycle | Input to 102 a | Input to 102 b | Output of 103 | Output of 104 | Input c to 106 | d-c/d+c | Input d to 106 | Output of 106 | Input e to 113 | Input f to 113 | Output of 113 | Output of 109 | Output of 110 |
|---|---|---|---|---|---|---|---|---|---|---|---|---|---|
| T1 | $k_2$ | $b_2(i-1)$ | $k_9 b_9(i-1)$ | $k_{10} b_{10}(i-1)$ | $k_{10} b_{10}(i-1)$ | − | $AU(i)$ | $AU(i)$ | $Y_1(i-1)$ | $2^{-8} Y_1(i-1)$ | $b_2(i-1)$ | $Y_1(i-1)$ | $Y_1(i-2)$ |
| T2 | $k_1$ | $b_1(i-1)$ | $k_8 b_8(i-1)$ | $k_9 b_9(i-1)$ | $k_9 b_9(i-1)$ | − | $Y_{10}(i)$ | $Y_{10}(i)$ | $U(i+1)$ | 0 | $b_1(i-1)$ | $b_{10}(i-1)$ | $Y_1(i-1)$ |
| T3 | A | $U(i+1)$ | $k_7 b_7(i-1)$ | $k_8 b_8(i-1)$ | $k_8 b_8(i-1)$ | − | $Y_9(i)$ | $Y_9(i)$ | $Y_9(i)$ | 0 | $U(i+1)$ | $b_9(i-1)$ | |
| T4 | $k_9$ | $Y_9(i)$ | $k_6 b_6(i-1)$ | $k_7 b_7(i-1)$ | $k_7 b_7(i-1)$ | − | $Y_8(i)$ | $Y_8(i)$ | $Y_8(i)$ | 0 | $Y_9(i)$ | | |
| T5 | $k_8$ | $Y_8(i)$ | $k_5 b_5(i-1)$ | $k_6 b_6(i-1)$ | $k_6 b_6(i-1)$ | − | $Y_7(i)$ | $Y_7(i)$ | $Y_7(i)$ | 0 | $Y_8(i)$ | | |
| T6 | $k_7$ | $Y_7(i)$ | $k_4 b_4(i-1)$ | $k_5 b_5(i-1)$ | $k_5 b_5(i-1)$ | − | $Y_6(i)$ | $Y_6(i)$ | $Y_6(i)$ | 0 | $Y_7(i)$ | | |
| T7 | $k_6$ | $Y_6(i)$ | $k_3 b_3(i-1)$ | $k_4 b_4(i-1)$ | $k_4 b_4(i-1)$ | − | $Y_5(i)$ | $Y_5(i)$ | $Y_5(i)$ | 0 | $Y_6(i)$ | | |
| T8 | $k_5$ | $Y_5(i)$ | $k_2 b_2(i-1)$ | $k_3 b_3(i-1)$ | $k_3 b_3(i-1)$ | − | $Y_4(i)$ | $Y_4(i)$ | $Y_4(i)$ | 0 | $Y_5(i)$ | | |
| T9 | $k_4$ | $Y_4(i)$ | $k_1 b_1(i-1)$ | $k_2 b_2(i-1)$ | $k_2 b_2(i-1)$ | − | $Y_3(i)$ | $Y_3(i)$ | $Y_3(i)$ | 0 | $Y_4(i)$ | | |
| T10 | $k_3$ | $Y_3(i)$ | $AU(i+1)$ | $k_1 b_1(i-1)$ | $k_1 b_1(i-1)$ | − | $Y_2(i)$ | $Y_2(i)$ | $Y_2(i)$ | 0 | $Y_3(i)$ | | |

Fig. 6B

| Cycle | Input to 102 a | Input to 102 b | Output of 103 | Output of 104 | Input c to 106 | d-c / d+c | Input d to 106 | Output of 106 | Input e to 113 | Input f to 113 | Output of 113 | Output of 109 | Output of 110 |
|---|---|---|---|---|---|---|---|---|---|---|---|---|---|
| T11 | $k_2$ | $Y_2(i)$ | $k_9 Y_9(i)$ | $AU(i+1)$ | $k_9 Y_9(i)$ | + | $b_9(i-1)$ | $Y_1(i)$ | $Y_1(i)$ | 0 | $Y_2(i)$ | $b_9(i-1)$ | $Y_1(i-1)$ |
| T12 | $k_1$ | $Y_1(i)$ | $k_8 Y_8(i)$ | | $k_8 Y_8(i)$ | + | $b_8(i-1)$ | $b'_{10}(i)$ | $b'_{10}(i)$ | $2^{-8}b_{10}(i)$ | $Y_1(i)$ | $b_8(i-1)$ | |
| T13 | $k_{10}$ | $b_{10}(i)$ | $k_7 Y_7(i)$ | | $k_7 Y_7(i)$ | + | $b_7(i-1)$ | $b'_9(i)$ | $b'_9(i)$ | $2^{-8}b_9(i)$ | $b_{10}(i)$ | $b_7(i-1)$ | |
| T14 | $k_9$ | $b_9(i)$ | $k_6 Y_6(i)$ | | $k_6 Y_6(i)$ | + | $b_6(i-1)$ | $b'_8(i)$ | $b'_8(i)$ | $2^{-8}b_8(i)$ | $b_9(i)$ | $b_6(i-1)$ | |
| T15 | $k_8$ | $b_8(i)$ | $k_5 Y_5(i)$ | | $k_5 Y_5(i)$ | + | $b_5(i-1)$ | $b'_7(i)$ | $b'_7(i)$ | $2^{-8}b_7(i)$ | $b_8(i)$ | $b_5(i-1)$ | |
| T16 | $k_7$ | $b_7(i)$ | $k_4 Y_4(i)$ | | $k_4 Y_4(i)$ | + | $b_4(i-1)$ | $b'_6(i)$ | $b'_6(i)$ | $2^{-8}b_6(i)$ | $b_7(i)$ | $b_4(i-1)$ | |
| T17 | $k_6$ | $b_6(i)$ | $k_3 Y_3(i)$ | | $k_3 Y_3(i)$ | + | $b_3(i-1)$ | $b'_5(i)$ | $b'_5(i)$ | $2^{-8}b_5(i)$ | $b_6(i)$ | $b_3(i-1)$ | |
| T18 | $k_5$ | $b_5(i)$ | $k_2 Y_2(i)$ | | $k_2 Y_2(i)$ | + | $b_2(i-1)$ | $b'_4(i)$ | $b'_4(i)$ | $2^{-8}b_4(i)$ | $b_5(i)$ | $b_2(i-1)$ | |
| T19 | $k_4$ | $b_4(i)$ | $k_1 Y_1(i)$ | | $k_1 Y_1(i)$ | + | $b_1(i-1)$ | $b'_3(i)$ | $b'_3(i)$ | $2^{-8}b_3(i)$ | $b_4(i)$ | $b_1(i-1)$ | |
| T20 | $k_3$ | $b_3(i)$ | $k_{10} Y_{10}(i)$ | | $AU(i+1)$ | + | 0 | $b'_2(i)$ | $b'_2(i)$ | $2^{-8}b_2(i)$ | $b_3(i)$ | $Y_2(i)$ | $Y_1(i-1)$ |

| Cycle | Input a | Input b | Output of 103 | Output of 104 | Input c to 106 | d-c / d+c | Input d to 106 | Output of 106 | Input to 108 | Output of 108 | Output of 109 | Output of 110 |
|---|---|---|---|---|---|---|---|---|---|---|---|---|
| T1 | $k_2$ | $b_3(i-1)$ | $k_9 b_9(i-1)$ | $k_{10} b_{10}(i-1)$ | $k_{10} b_{10}(i-1)$ | – | $AU(i)$ | $AU(i)$ | $Y_1(i-1)$ | $b_2(i-1)$ | $Y_1(i-1)$ | $Y_1(i-2)$ |
| T2 | $k_1$ | $b_2(i-1)$ | $k_8 b_8(i-1)$ | $k_9 b_9(i-1)$ | $k_9 b_9(i-1)$ | – | $Y_{10}(i)$ | $Y_{10}(i)$ | $U(i+1)$ | $Y_1(i-1)$ | $b_{10}(i-1)$ | $Y_1(i-1)$ |
| T3 | $A$ | $b_1(i-1)$ | $k_7 b_7(i-1)$ | $k_8 b_8(i-1)$ | $k_8 b_8(i-1)$ | – | $Y_9(i)$ | $Y_9(i)$ | $Y_9(i)$ | $U(i+1)$ | $b_9(i-1)$ | |
| T4 | $k_9$ | $U(i+1)$ | $k_6 b_6(i-1)$ | $k_7 b_7(i-1)$ | $k_7 b_7(i-1)$ | – | $Y_8(i)$ | $Y_8(i)$ | $Y_8(i)$ | $Y_9(i)$ | | |
| T5 | $k_8$ | $Y_9(i)$ | $k_5 b_5(i-1)$ | $k_6 b_6(i-1)$ | $k_6 b_6(i-1)$ | – | $Y_7(i)$ | $Y_7(i)$ | $Y_7(i)$ | $Y_8(i)$ | | |
| T6 | $k_7$ | $Y_8(i)$ | $k_4 b_4(i-1)$ | $k_5 b_5(i-1)$ | $k_5 b_5(i-1)$ | – | $Y_6(i)$ | $Y_6(i)$ | $Y_6(i)$ | $Y_7(i)$ | | |
| T7 | $k_6$ | $Y_7(i)$ | $k_3 b_3(i-1)$ | $k_4 b_4(i-1)$ | $k_4 b_4(i-1)$ | – | $Y_5(i)$ | $Y_5(i)$ | $Y_5(i)$ | $Y_6(i)$ | | |
| T8 | $k_5$ | $Y_6(i)$ | $k_2 b_2(i-1)$ | $k_3 b_3(i-1)$ | $k_3 b_3(i-1)$ | – | $Y_4(i)$ | $Y_4(i)$ | $Y_4(i)$ | $Y_5(i)$ | | |
| T9 | $k_4$ | $Y_5(i)$ | $k_1 b_1(i-1)$ | $k_2 b_2(i-1)$ | $k_2 b_2(i-1)$ | – | $Y_3(i)$ | $Y_3(i)$ | $Y_3(i)$ | $Y_4(i)$ | | |
| T10 | $k_3$ | $Y_4(i)$ | $AU(i+1)$ | $k_1 b_1(i-1)$ | $k_1 b_1(i-1)$ | – | $Y_2(i)$ | $Y_2(i)$ | $Y_2(i)$ | $Y_3(i)$ | | |

Fig. 8B

| Cycle | Input a | Input b | Output of 103 | Output of 104 | Input c to 106 | d-c / d+c | Input d to 106 | Output of 106 | Input to 108 | Output of 108 | Output of 109 | Output of 110 |
|---|---|---|---|---|---|---|---|---|---|---|---|---|
| T11 | $k_2$ | $y_3(i)$ | $k_9 y_9(i)$ | $AU(i+1)$ | $k_9 y_9(i)$ | + | $b_9(i-1)$ | $y_1(i)$ | $y_1(i)$ | $y_2(i)$ | $b_9(i-1)$ | $y_1(i-1)$ |
| T12 | $k_1$ | $y_2(i)$ | $k_8 y_8(i)$ | | $k_8 y_8(i)$ | + | $b_8(i-1)$ | $b_{10}(i)$ | $y_1(i)$ | $y_1(i)$ | $b_8(i-1)$ | |
| T13 | $k_{10}$ | $y_1(i)$ | $k_7 y_7(i)$ | | $k_7 y_7(i)$ | + | $b_7(i-1)$ | $b_9(i)$ | $b_{10}(i)$ | $b_{10}(i)$ | $b_7(i-1)$ | |
| T14 | $k_9$ | $b_{10}(i)$ | $k_6 y_6(i)$ | | $k_6 y_6(i)$ | + | $b_6(i-1)$ | $b_8(i)$ | $b_9(i)$ | $b_9(i)$ | $b_6(i-1)$ | |
| T15 | $k_8$ | $b_9(i)$ | $k_5 y_5(i)$ | | $k_5 y_5(i)$ | + | $b_5(i-1)$ | $b_7(i)$ | $b_8(i)$ | $b_8(i)$ | $b_5(i-1)$ | |
| T16 | $k_7$ | $b_8(i)$ | $k_4 y_4(i)$ | | $k_4 y_4(i)$ | + | $b_4(i-1)$ | $b_6(i)$ | $b_7(i)$ | $b_7(i)$ | $b_4(i-1)$ | |
| T17 | $k_6$ | $b_7(i)$ | $k_3 y_3(i)$ | | $k_3 y_3(i)$ | + | $b_3(i-1)$ | $b_5(i)$ | $b_6(i)$ | $b_6(i)$ | $b_3(i-1)$ | |
| T18 | $k_5$ | $b_6(i)$ | $k_2 y_2(i)$ | | $k_2 y_2(i)$ | + | $b_2(i-1)$ | $b_4(i)$ | $b_5(i)$ | $b_5(i)$ | $b_2(i-1)$ | |
| T19 | $k_4$ | $b_5(i)$ | $k_1 y_1(i)$ | | $k_1 y_1(i)$ | + | $b_1(i-1)$ | $b_3(i)$ | $b_4(i)$ | $b_4(i)$ | $b_1(i-1)$ | |
| T20 | $k_3$ | $b_4(i)$ | $k_{10} b_{10}(i)$ | | $AU(i+1)$ | + | 0 | $b_2(i)$ | $b_3(i)$ | $b_3(i)$ | $y_2(i)$ | $y_1(i-1)$ |

| Cycle | Input a | Input b | Output of 103 | Output of 104 | Input C to 106 | d-c / d+c | Input d to 106 | Output of 106 | Input e to 113 | Input f to 113 | Output of 113 | Output of 109 | Output of 110 |
|---|---|---|---|---|---|---|---|---|---|---|---|---|---|
| T1 | $k_2$ | $b_3(i-1)$ | $k_9b_9(i-1)$ | $k_{10}b_{10}(i-1)$ | $k_{10}b_{10}(i-1)$ | − | $AU(i)$ | $AU(i)$ | $Y_1(i-1)$ | $2^{-8}Y_1(i-1)$ | $b_2(i-1)$ | $Y_1(i-1)$ | $Y_1(i-2)$ |
| T2 | $k_1$ | $b_2(i-1)$ | $k_8b_8(i-1)$ | $k_9b_9(i-1)$ | $k_9b_9(i-1)$ | − | $Y_{10}(i)$ | $Y_{10}(i)$ | $U(i+1)$ | 0 | $b_1(i-1)$ | $b_{10}(i-1)$ | $Y_1(i-1)$ |
| T3 | $A$ | $b_1(i-1)$ | $k_7b_7(i-1)$ | $k_8b_8(i-1)$ | $k_8b_8(i-1)$ | − | $Y_9(i)$ | $Y_9(i)$ | $Y_9(i)$ | 0 | $U(i+1)$ | $b_9(i-1)$ | |
| T4 | $k_9$ | $U(i+1)$ | $k_6b_6(i-1)$ | $k_7b_7(i-1)$ | $k_7b_7(i-1)$ | − | $Y_8(i)$ | $Y_8(i)$ | $Y_8(i)$ | 0 | $Y_9(i)$ | | |
| T5 | $k_8$ | $Y_9(i)$ | $k_5b_5(i-1)$ | $k_6b_6(i-1)$ | $k_6b_6(i-1)$ | − | $Y_7(i)$ | $Y_7(i)$ | $Y_7(i)$ | 0 | $Y_8(i)$ | | |
| T6 | $k_7$ | $Y_8(i)$ | $k_4b_4(i-1)$ | $k_5b_5(i-1)$ | $k_5b_5(i-1)$ | − | $Y_6(i)$ | $Y_6(i)$ | $Y_6(i)$ | 0 | $Y_7(i)$ | | |
| T7 | $k_6$ | $Y_7(i)$ | $k_3b_3(i-1)$ | $k_4b_4(i-1)$ | $k_4b_4(i-1)$ | − | $Y_5(i)$ | $Y_5(i)$ | $Y_5(i)$ | 0 | $Y_6(i)$ | | |
| T8 | $k_5$ | $Y_6(i)$ | $k_2b_2(i-1)$ | $k_3b_3(i-1)$ | $k_3b_3(i-1)$ | − | $Y_4(i)$ | $Y_4(i)$ | $Y_4(i)$ | 0 | $Y_5(i)$ | | |
| T9 | $k_4$ | $Y_5(i)$ | $k_1b_1(i-1)$ | $k_2b_2(i-1)$ | $k_2b_2(i-1)$ | − | $Y_3(i)$ | $Y_3(i)$ | $Y_3$ | 0 | $Y_4(i)$ | | |
| T10 | $k_3$ | $Y_4(i)$ | $AU(i+1)$ | $k_1b_1(i-1)$ | $k_1b_1(i-1)$ | − | $Y_2(i)$ | $Y_2(i)$ | $Y_2(i)$ | 0 | $Y_3(i)$ | | |

Fig. 10B

| Cycle | Input a | Input b | Output of 103 | Output of 104 | Input C to 106 | d-c/d+c | Input d to 106 | Output of 106 | Input e to 113 | Input f to 113 | Output of 113 | Output of 109 | Output of 110 |
|---|---|---|---|---|---|---|---|---|---|---|---|---|---|
| T11 | $k_2$ | $Y_3(i)$ | $k_9Y_9(i)$ | $AU(i+1)$ | $k_9Y_9(i)$ | + | $b_9(i-1)$ | $Y_1(i)$ | $Y_1(i)$ | 0 | $Y_2(i)$ | $b_9(i-1)$ | $Y_1(i-1)$ |
| T12 | $k_1$ | $Y_2(i)$ | $k_8Y_8(i)$ | | $k_8Y_8(i)$ | + | $b_8(i-1)$ | $b'_{10}(i)$ | $b'_{10}(i)$ | $2^{-8}b'_{10}(i)$ | $Y_1(i)$ | $b_8(i-1)$ | |
| T13 | $k_{10}$ | $Y_1(i)$ | $k_7Y_7(i)$ | | $k_7Y_7(i)$ | + | $b_7(i-1)$ | $b'_9(i)$ | $b'_9(i)$ | $2^{-8}b'_9(i)$ | $b_{10}(i)$ | $b_7(i-1)$ | |
| T14 | $k_9$ | $b_{10}(i)$ | $k_6Y_6(i)$ | | $k_6Y_6(i)$ | + | $b_6(i-1)$ | $b'_8(i)$ | $b'_8(i)$ | $2^{-8}b'_8(i)$ | $b_9(i)$ | $b_6(i-1)$ | |
| T15 | $k_8$ | $b_9(i)$ | $k_5Y_5(i)$ | | $k_5Y_5(i)$ | + | $b_5(i-1)$ | $b'_7(i)$ | $b'_7(i)$ | $2^{-8}b'_7(i)$ | $b_8(i)$ | $b_5(i-1)$ | |
| T16 | $k_7$ | $b_8(i)$ | $k_4Y_4(i)$ | | $k_4Y_4(i)$ | + | $b_4(i-1)$ | $b'_6(i)$ | $b'_6(i)$ | $2^{-8}b'_6(i)$ | $b_7(i)$ | $b_4(i-1)$ | |
| T17 | $k_6$ | $b_7(i)$ | $k_3Y_3(i)$ | | $k_3Y_3(i)$ | + | $b_3(i-1)$ | $b'_5(i)$ | $b'_5(i)$ | $2^{-8}b'_5(i)$ | $b_6(i)$ | $b_3(i-1)$ | |
| T18 | $k_5$ | $b_6(i)$ | $k_2Y_2(i)$ | | $k_2Y_2(i)$ | + | $b_2(i-1)$ | $b'_4(i)$ | $b'_4(i)$ | $2^{-8}b'_4(i)$ | $b_5(i)$ | $b_2(i-1)$ | |
| T19 | $k_4$ | $b_5(i)$ | $k_1Y_1(i)$ | | $k_1Y_1(i)$ | + | $b_1(i-1)$ | $b'_3(i)$ | $b'_3(i)$ | $2^{-8}b'_3(i)$ | $b_4(i)$ | $b_1(i-1)$ | |
| T20 | $k_3$ | $b_4(i)$ | $k_{10}Y_{10}(i)$ | | $AU(i+1)$ | + | 0 | $b'_2(i)$ | $b'_2(i)$ | $2^{-8}b'_2(i)$ | $b_3(i)$ | $Y_2(i)$ | $Y_1(i-1)$ |

DIGITAL FILTER

BACKGROUND OF THE INVENTION

The present invention relates to a digital filter for a voice synthesis circuit which is derived on the basis of the principle of linear predictive coding; in particular, the present invention relates to a method of forming a digital filter for voice synthesis which is derived on the basis of the principle of linear predictive coding of the lattice type.

A digital filter of the lattice type was already described in detailed in chapter 5 of the book entitled "Linear Prediction of Speech", written by Markel and Gray (Springer-Verlag, New York, 1976).

The historical analysis of the means for fabricating said digital filter of the lattice type was disclosed in detail in Japanese Patent Laid-Open Specification No. 7838/1979 in which a means for fabricating a digital filter of the lattice type by using one multiplication circuit and one addition-subtraction circuit was proposed.

SUMMARY OF THE INVENTION

It is an object of the present invention to provide a digital filter which has operating characteristics which are sufficient for voice synthesis even if the operating clock frequency is low.

It is another object of the present invention to provide a means for fabricating a digital filter of the lattice type by using one multiplication circuit and one addition-subtraction circuit which is similar in design to the above described circuit disclosed by Japanese Patent Laid-Open Specification No. 7838/1979 and to provide a digital filter containing an attenuation term.

The model of a digital filter containing an attenuation term and its design on the basis of a stored-program form was disclosed in "one chip PARCOR synthesizer" written by Yamada et al., of the Musashino Electrical Communication Laboratory of Nippon Telegraph and Telephone Public Corporation and printed in the Sogo-Zenkoku-Taikai conference papers '79 of The Institute of Electronics and Communication Engineers of Japan.

BRIEF DESCRIPTION OF THE DRAWINGS

The present invention will be described hereinafter by referring to the drawings.

FIGS. 8A and 8B are a timing-diagram showing the operation of another example of the present invention as shown in FIG. 7;

DESCRIPTION OF THE PREFERRED EMBODIMENTS

The basic construction of a voice synthesizer used in the present invention was described in detail in the article entitled "Voice synthesizer for VOCODER of linear predicting coding (LPC) type was realized by using three tips" written by R. Wiggins and L. Brantingham (Nikkei Electronics., Jan. 8, 1979, pp. 147–162).

Figure 1:
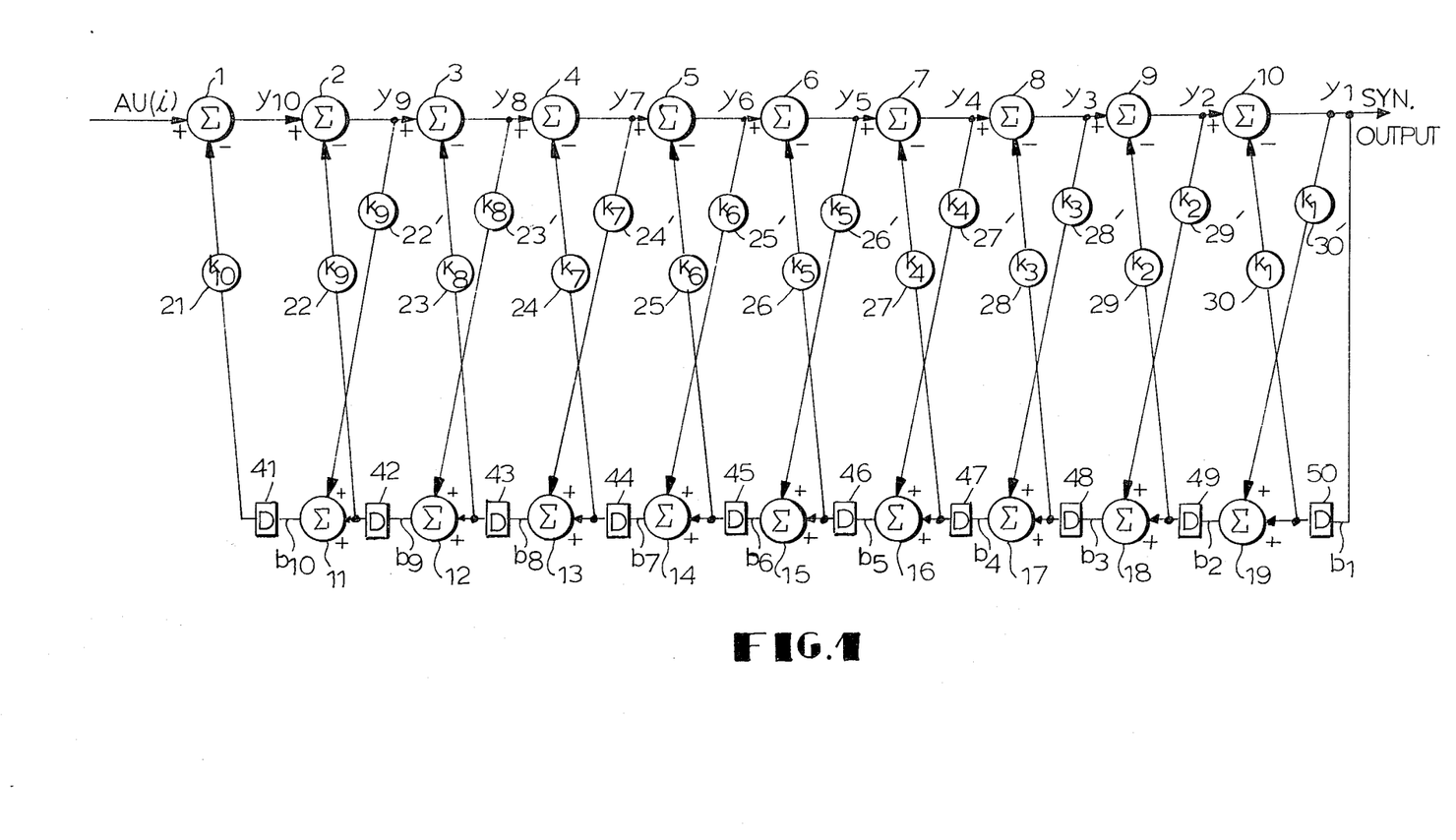
FIG. 1 shows a model of a synthetic digital filter.

FIG. 1 is a model showing a digital filter of the lattice type as used in the voice synthesizer. Referring to FIG. 1, AU(i) designates an input signal which is a product of an amplitude signal A and an excitation signal U(i) in the i-th cycle of time. $y_1$ is a synthetic output signal which is put into DA transformer. Referring to FIG. 1 which shows an example of a 10-step type of filter, 1 to 10 designate subtracters, 11 to 19 designate adders, 21 to 30 and 22′ to 30′ designate multipliers for multiplying by filter coefficients $k_i (i=1, 2, \sim 10)$ and 41 to 50 designate delaying devices of a one time cycle delay. $y_{10}$ to $y_1$ designate output signals from said subtracters 1 to 10, $b_{10}$ to $b_2$ designate output signals from said adders 11 to 19 and $b_1$ is equal to $y_1$. For example, the signal $y_8$ can be calculated by subtracting the product obtained by multiplying the signal before one time cycle $b_8$ by the coefficient $k_8$ from the signal $y_9$. The signal $b_8$ can be calculated by adding the product obtained by multiplying the signal $b_7$ before one time cycle by the coefficient $k_7$ to the signal $y_7$.

Table 1 shows mathematically the relationship between the signals $y_{10}$ to $y_1$ and $b_{10}$ to $b_1$.

Figure 2:
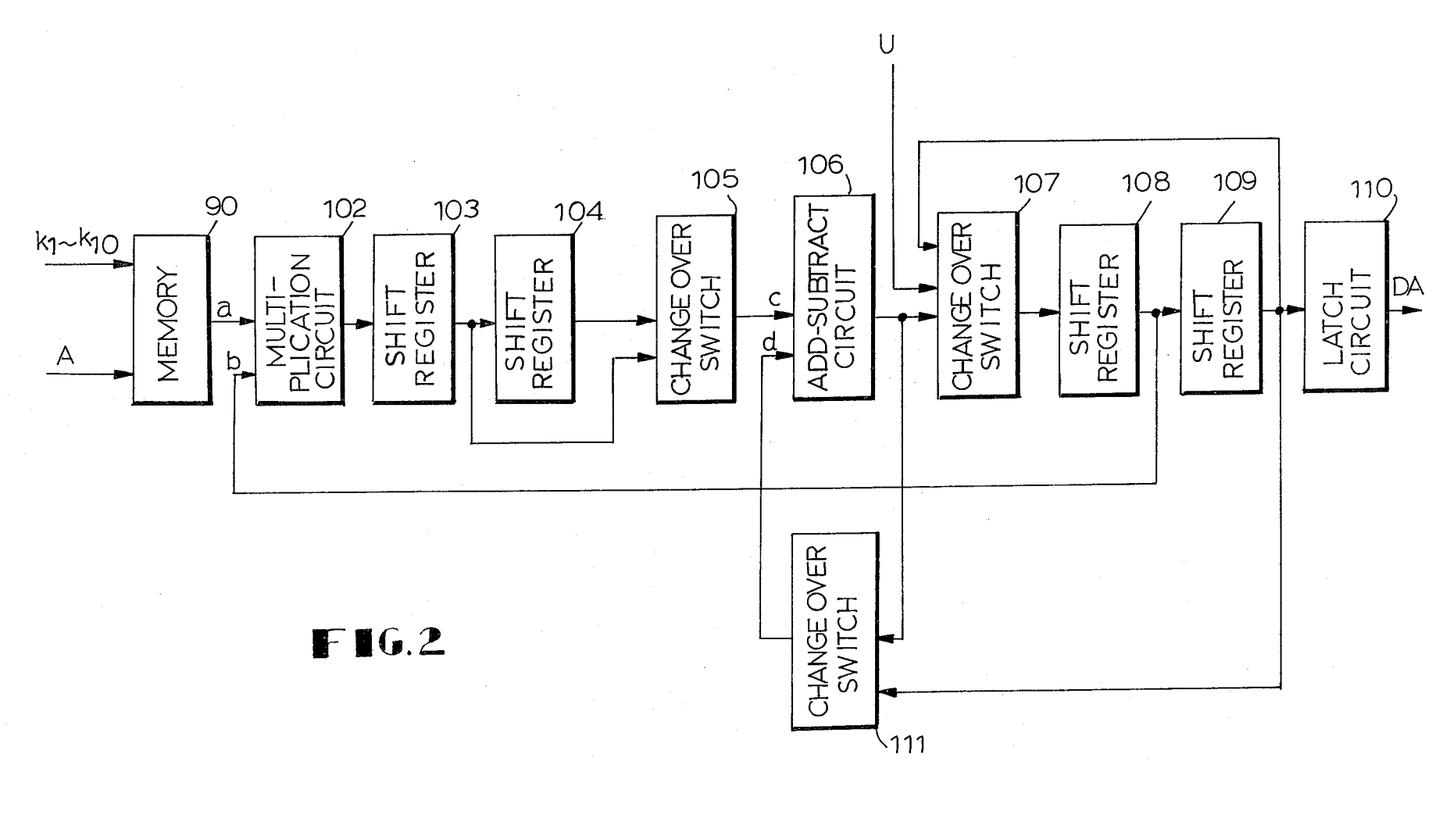
FIG. 2 is a block-diagram showing an example of the present invention.
Figure 2B:
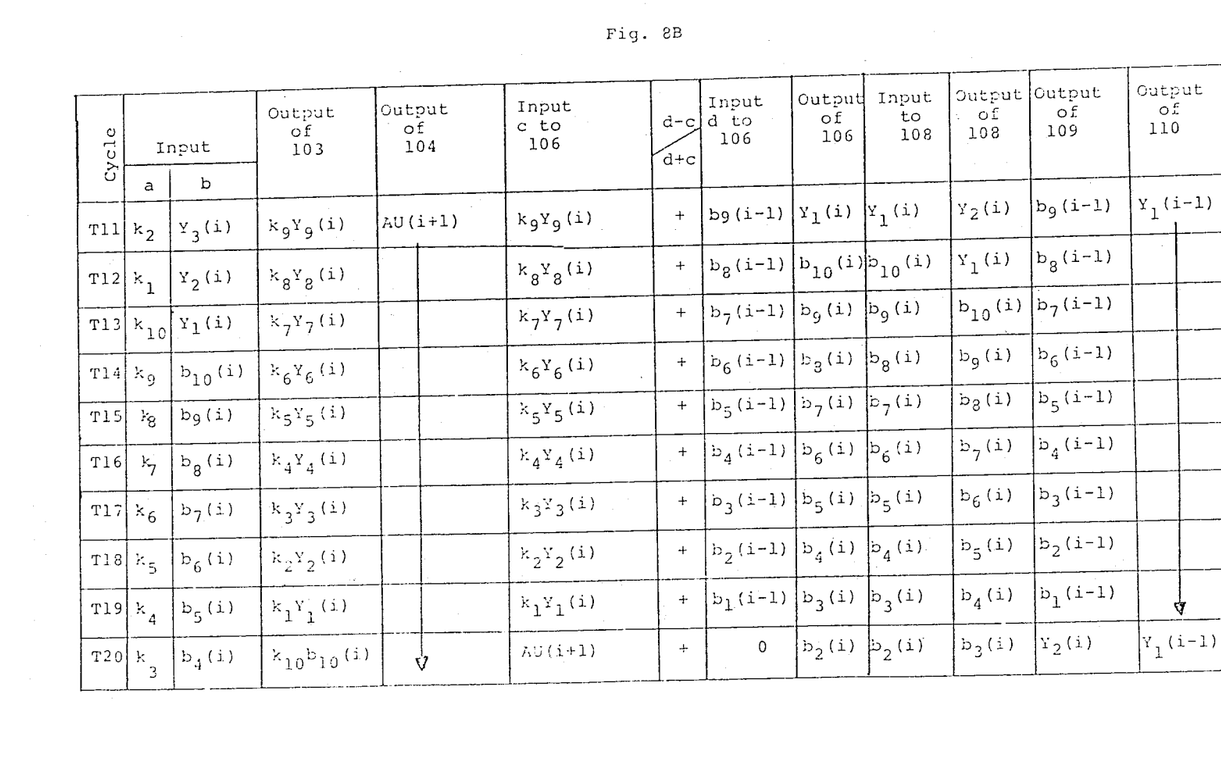

FIG. 2 shows an example of the present invention. Referring now to FIG. 2, 90 designates a K-stack a memory-device, which stores the digital values $k_1$ to $k_{10}$ representing filter coefficients and an amplitude signal A, 102 designates a multiplication circuit of which one input a is arranged in parallel to the output from K-stack 90. As a rule, a parallel operation circuit of an array type is used as the multiplication circuit 102. In the case of using Booth's algorithm, the operation of complementing can be done regardless of signs. For example, in the case of using Booth's secondary algorithm, the operation can be finished by repeating four steps of parallel addition when the number of parallel bits from said K-stack 90 is equal to 10. Booth's secondary algorithm was described in detail in the article entitled "Multiplication operation circuit on the basis of parallel operation of the improved LSI-nization" (Nikkei Electronics., No. 5–29, 76–90, 1978). 103 designates a three-step shift register used as the first delay circuit, 104 designates a one-step intermittently operating shift register used as the first intermittently operating delay circuit, 105 designates a change-over switch for selecting an output either from said shift register 103 or an output from said intermittently separating shift register 104, 106 designates an addition-subtraction circuit of which one input c is an output from said change-over switch 105, 107 designates a change-over switch, 108 designates a one-step shift register used as the second delay circuit, 109 designates a nine-step intermittently operating shift register used as the second intermittently operating delay circuit and is connected to said shift register 108. 110 designates a latch circuit which holds the digital value obtained by the above described operations and then sends it out to a DA transformer (not shown in the figure). 111 designates a change-over switch for selecting an output either from said addition-subtraction circuit 106 or an output from said intermittently operating shift register 109, its output being used as the other input d for said addition-subtraction circuit 106. Said change-over switch 107 changes over an output from said addition-subtraction circuit 106, an output from said intermittently operating shift register 109 and an exciting signal U(i), its output being used as an input for said shift register 108. A part of an output from said shift register 108 is also used as the other input b for said multiplication circuit 102.

Referring to FIG. 2, said amplitude signal A and said exciting signal U(i) is put into said shift register 108 through said K-stack 90 and said change-over switch 107, respectively, in a spare time period during the operation time of the circuit of FIG. 2, and are then subjected to multiplication A×U(i) in another spare time period during the operation time.

Figure 3A:
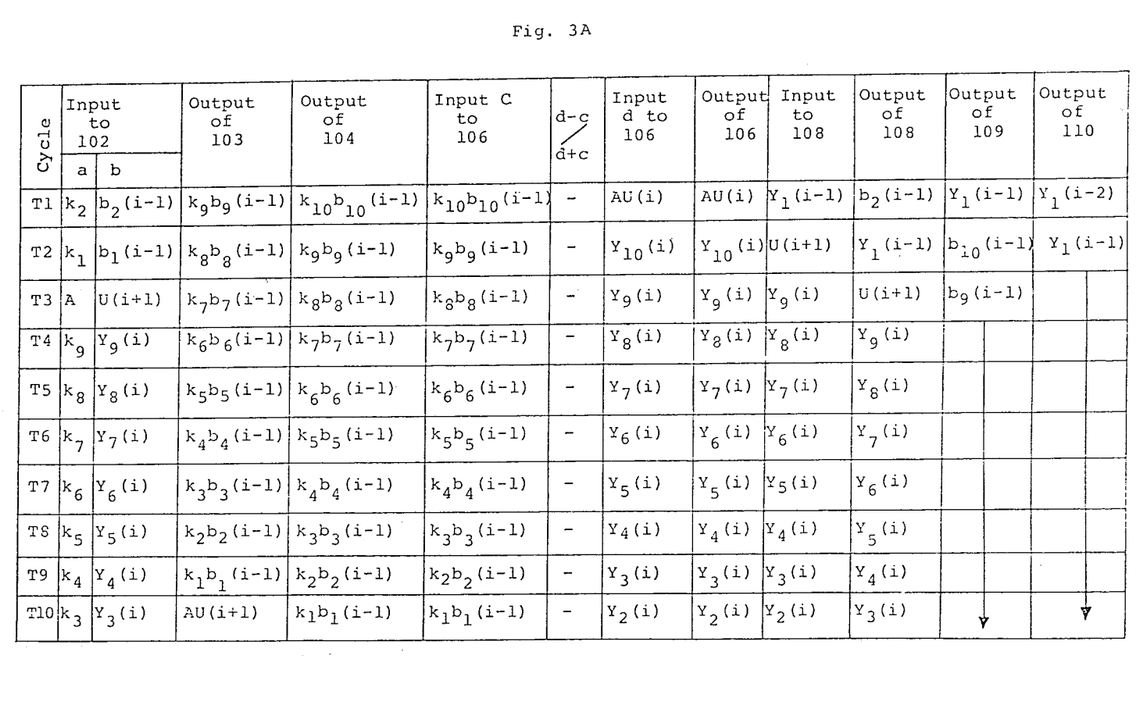
FIGS. 3A and 3B are a timing-diagram showing the operation of an example of the present invention as shown in FIG. 2.
Figure 3B:
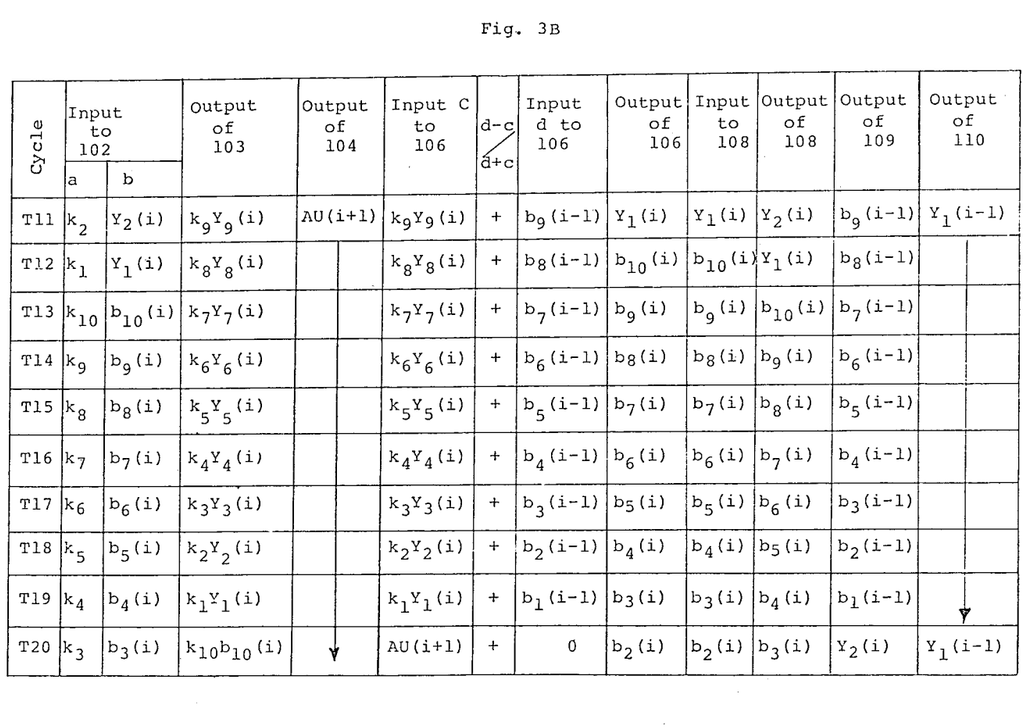

FIGS. 3A–3B show the detailed timing diagram in the practical operation of the formulae shown in Table 1 by means of the circuit shown in FIG. 2. Referring to FIGS. 3A–3B, the coefficient $k_i$ or the information of an amplitude A is used as an input a for said multiplication circuit 102 and the output from said one-step shift register 108 is used as an input b for said multiplication circuit 102. The result of the addition appears in the form of an output from said three-step shift register 103 after 7 cycles through said four-step multiplication circuit 102 and said three-step shift register 103.

Said one-step intermittently acting shift register 104 is in this shift-action during the cycle $T_1$ to $T_{11}$ and interrupts shift-operation during the cycle $T_{12}$ to $T_{20}$. The output from said one-step intermittently operating shift register 104 is used as the input c for said addition-subtraction circuit 106 during the cycle $T_{20}$ and cycles $T_1$ to $T_{10}$ and the output from said three-step shift register 103 is used as the input c for said addition-subtraction circuit 106 during the cycles $T_{11}$ to $T_{19}$. The output from said addition-subtraction circuit 106, the output from said nine-step intermittently operating shift register 109 and 0 is used as the input d for said addition-subtraction circuit 106 during the cycles $T_1$ to $T_{10}$, $T_{11}$ to $T_{19}$ and $T_{20}$, respectively. Said addition-subtraction circuit 106 carries out the subtracting operation in which the input c is subtracted from the input d during the cycles $T_1$ to $T_{10}$ and the adding operation in which the input c is added to the input d during the cycles $T_{11}$ to $T_{20}$.

The output from said nine-step intermittently operating shift register 109, the exciting signal U(i+1) and the output from said addition-subtraction circuit 106 is used as the input for said one-step shift register 108 during the cycles $T_1$, $T_2$ and $T_3$ to $T_{20}$, respectively. Said nine-step intermittently operating shift register 109 is in its shift-operation during the cycles $T_{11}$ to $T_2$ and interrupts shift-operation during the cycle $T_3$ to $T_{10}$. The contents of said latch circuit 110 are held during the cycles $T_2$ to $T_{20}$ and $T_1$ and refreshed during the transition point from the cycle $T_1$ to the cycle $T_2$.

The above described circuit construction makes it possible to carry out the operations shown in Table 1 by means of simple circuit-elements and the connection of circuit-elements to each other can also be simplified.

The attenuation operation may also be introduced. The insertion of a micro-loss in the synthesis filter may be taken as the counter-measure for limiting an unusual amplitude of synthetic voices. Its effect was described in detailed in the article entitled "The study of an analysis-synthesis method of PARCOR of deformed lattice type" (Material No. S77-06, Voice Study Meeting, The Acoustical Society of Japan, 1977, May).

Figures 4A, 4B:
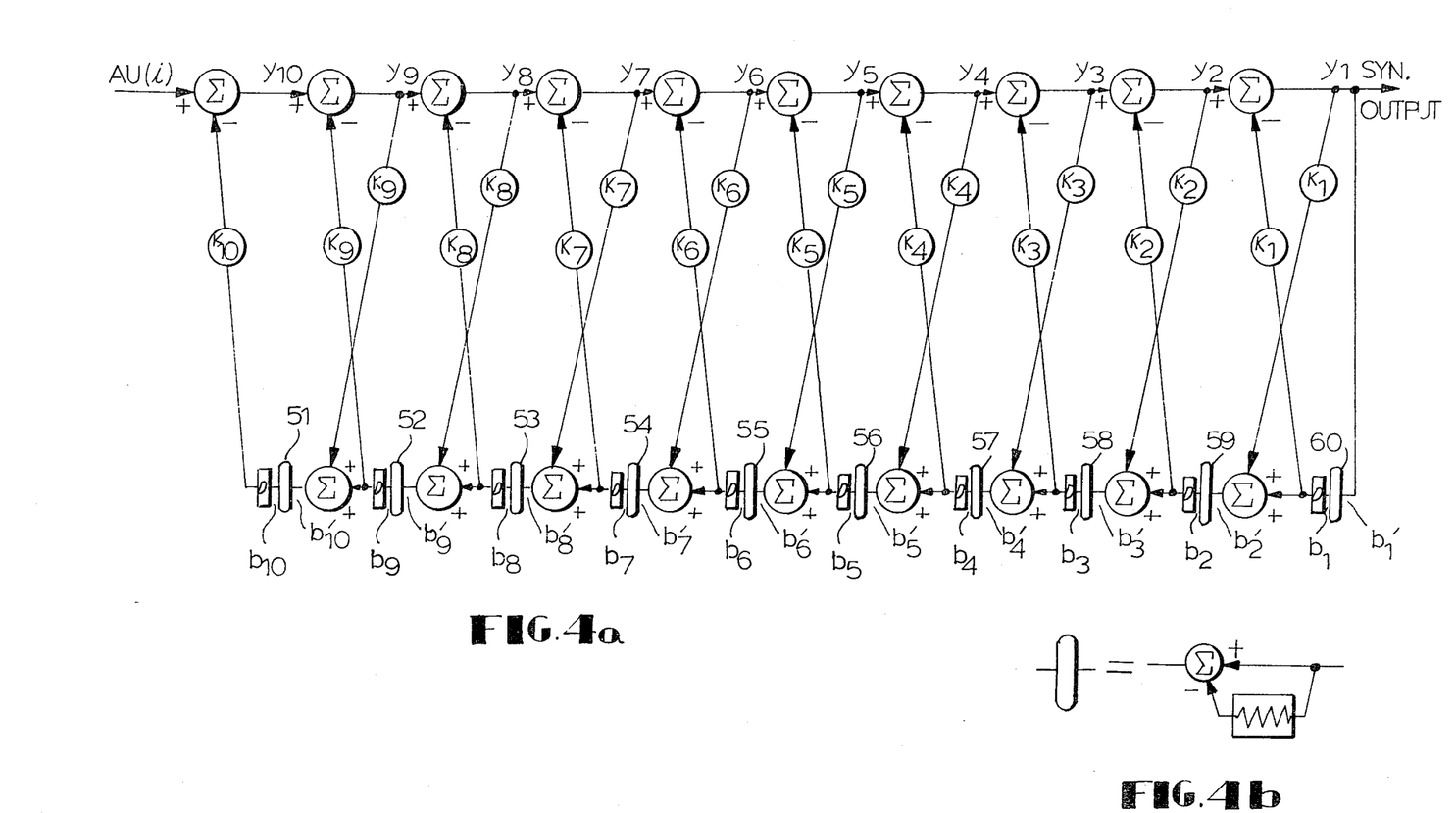
FIGS. 4A and 4B show a model of a synthetic digital filter containing an attenuation term.

FIG. 4a shows a model of a filter of the lattice type in which an attenuation operation is introduced. 51 to 60 designates attenuators, $b_{10}'$ to $b_1'$ designate the inputs for said attenuators 51 to 60 and $b_{10}$ to $b_1$ designate the output from said attenuators 51 to 60. The rest of the model is the same as that shown in FIG. 1. For example, the transition from $b_3'$ to $b_3$ leads to the reduction of the value to 255/256.

FIG. 4b shows an example of attenuators 51 to 60.

Table 2 shows the relationship between the signals $y_{10}$ to $y_1$, $b_{10}$ to $b_1$ and $b_{10}'$ to $b_1'$ as shown in FIG. 4.

Figure 5:
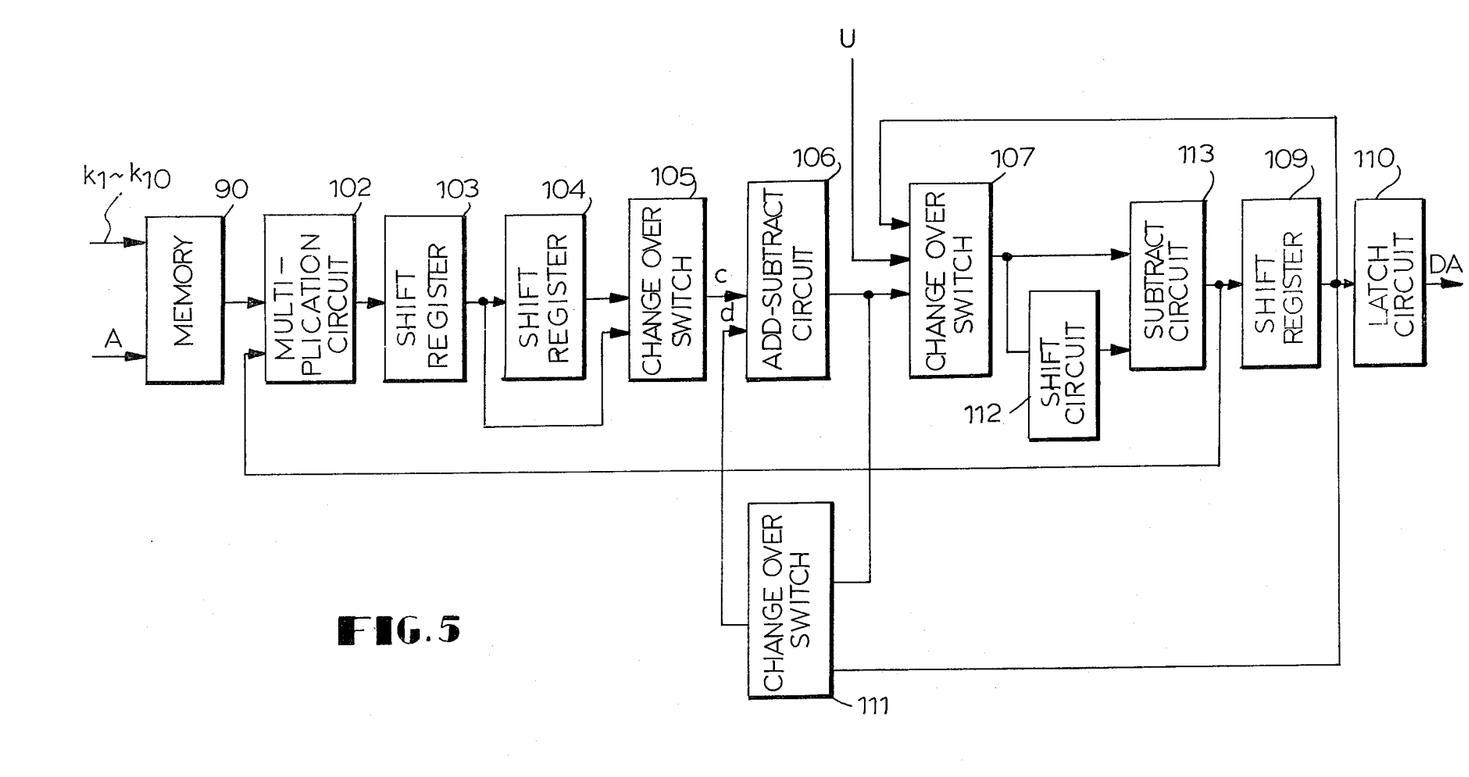
FIG. 5 is a block-diagram showing an example of the present invention containing an attenuation term.

FIG. 5 shows another example of the present invention. It is the same as FIG. 2 except that a shift circuit 112 and a subtraction circuit 113 are used instead of said one-step shift register 108. The output from said subtraction circuit 113 is the output from said change-over switch 107 times (1−1/256) if said shift circuit 112 is shifted to the right by eight bits. It is easy to adopt or except an attenuation operation because said shift circuit 112 and said subtraction circuit 113 are merely one-step shift registers if the output of said shift circuit 112 shown in FIG. 5 is equal to 0.

Figure 6A:
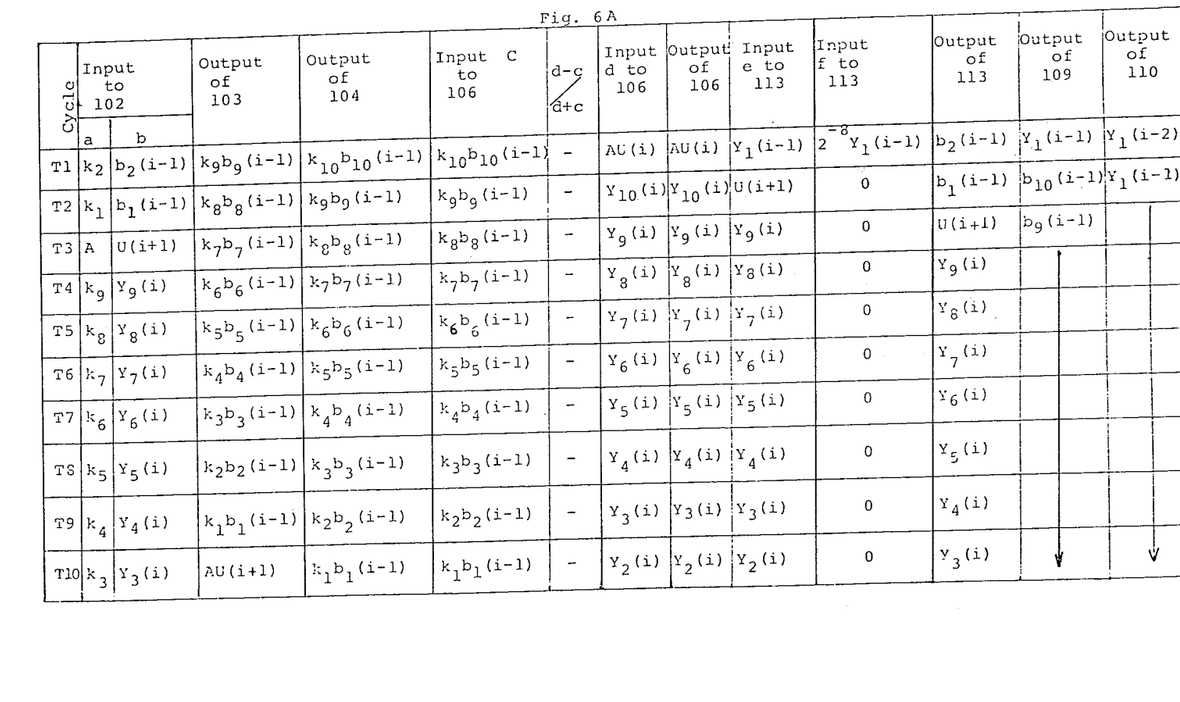
FIGS. 6A and 6B are a timing-diagram showing the operation of an example of the present invention as shown in FIG. 5.
Figure 6B:
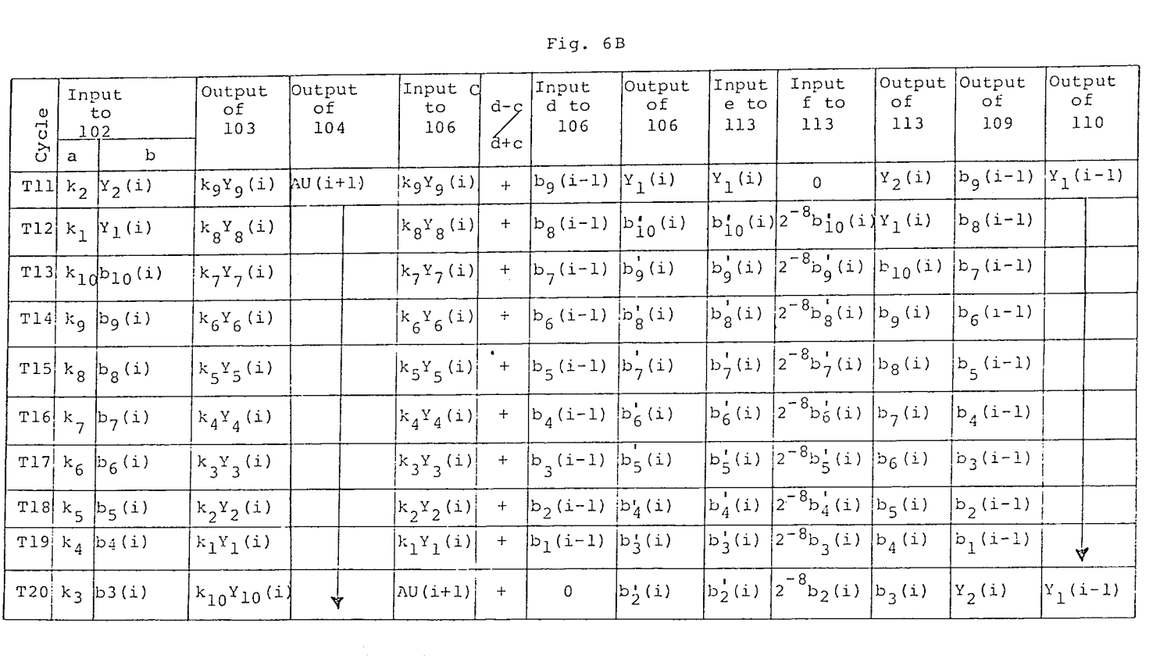

FIGS. 6A–6B show the timing diagram in the practical operation of the formulae shown in Table 2 by means of the construction shown in FIG. 5. FIGS. 6A–6B are the same as FIGS. 3A–3B except that the attenuation operation is carried out by means of the input and the output of said subtraction circuit 113. Referring to FIGS. 6A–6B, the construction in which a latch-circuit is connected with the output of a subtraction circuit and $b_1(i-1)$ is given to said latch-circuit during the cycle $T_2$ may be used, too.

As shown above, the present invention can remarkably simplify the construction of circuits and easily introduce an attenuation term.

Figure 7:
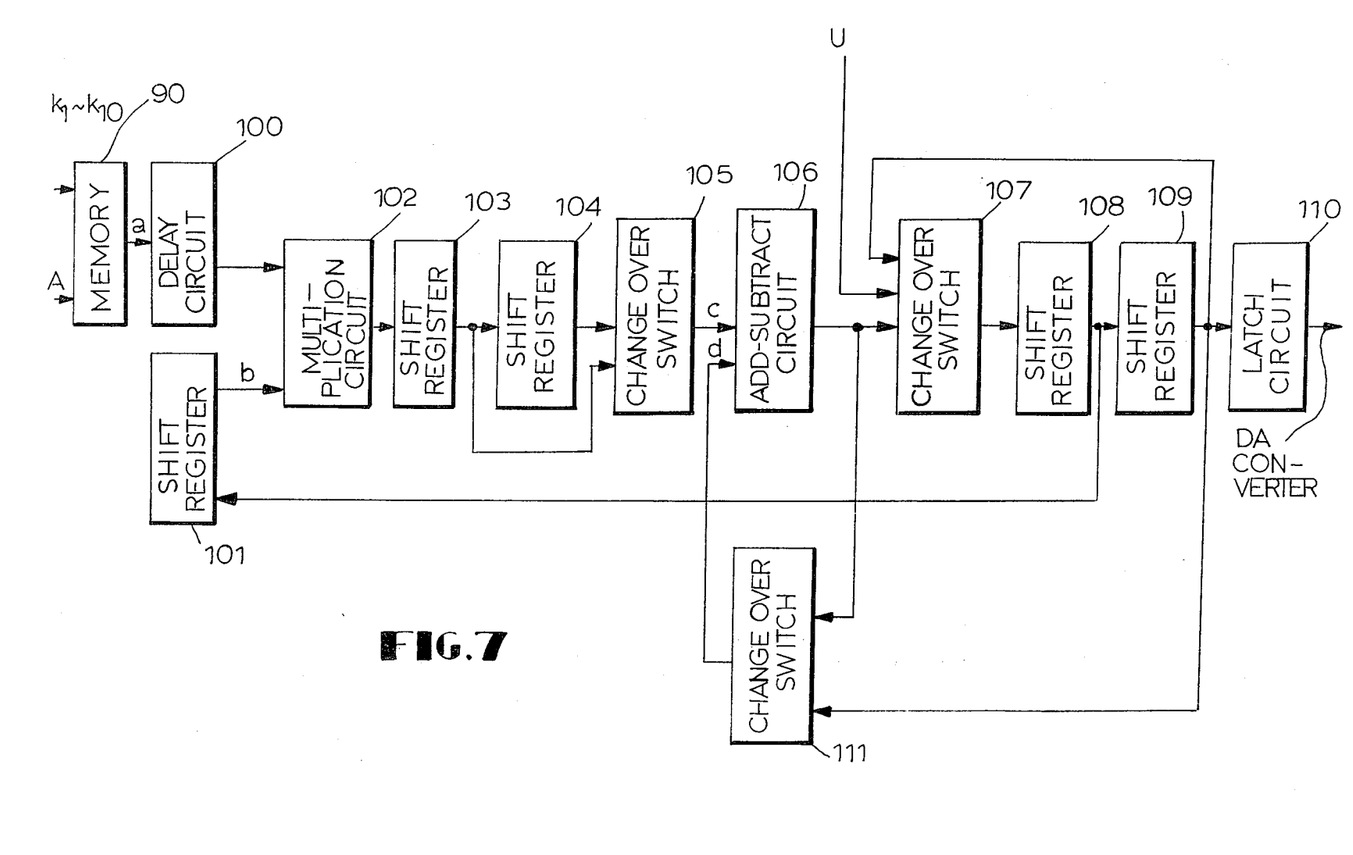
FIG. 7 is a block-diagram showing another example of the present invention.

FIG. 7 shows another example of the present invention. The same reference numbers as shown in the figure of the above described example designate the same elements as shown in the figure of the previously described example. However, also the same numbers will be explained again for completeness. 90 designates a k-stack used as a memory means which stores digital values $k_1$ to $k_{10}$ representing filter coefficients. 100 designates a one-step delay circuit in which the relationship between the input signal and the output signal is identical with the relationship between the input and the output in said one-step delay circuit. Thus, the output signal of said k-stack is encoded to obtain the signal which conforms to a multiplication algorithm of a multiplication circuit 102 as will be mentioned later. 101 designates the first shift register used as the first delay circuit means, 102 designates a multiplication circuit of which a first input terminal is connected to the output of said one-step delay circuit 100 in a manner such that plural parallel input segments (for plural bits) constituting the first input terminal are connected to corresponding plural parallel output segments (for plural bits) constituting the output of said one-step delay circuit, respectively. As a rule, a parallel operation circuit of an array type is used as said multiplication circuit. In the case of using Booth's algorithm, the operation of complementing can be carried out regardless of signs. For example, in case of using Booth's secondary algorithm, the four-step repetition of parallel addition is enough if the number of parallel bits from said k-stack 90 is 10. Booth's secondary algorithm was detailedly described in the article entitled "Multiplication operation circuit on the basis of parallel operation of the improved LSI-nization" (Nikkei Electronics., No. 5-29, 76-90, 1978). 103 designates the second shift register used as the second delay circuit means, 104 designates the first intermittently acting shift register used as the first intermittently operating delay circuit means. 105 designates a change-over switch for the output and the input of said second shift register 103, 106 designates an addition-subtraction circuit of which one input c is the output from said change-over switch 105, 107 designates a change-over switch, 108 designates the third shift register used as the third delay circuit means, 109 designates the second intermittently operating shift register used as the second intermittently operating delay circuit means, said second intermittently operating shift register 109 being connected to said third shift register 108. 110 designates a latch circuit which holds a digital value obtained by the operations described above and sends it out to a DA transformer (not shown in the figure). 111 designates a change-over switch for selecting either the output from said addition-subtraction circuit 106 or the output from said second intermittently operating shift register 109, its output being the other input d for said addition-subtraction circuit 106. Said change-over switch 107 also exchanges over the output from said addition-subtraction circuit 106, the output from said second intermittently acting shift register 109 and an exciting signal U(i), the output from said change-over switch 107 being used as an input for said third shift register 108. The output from said first shift register 101 is also used as the other input b for said multiplication circuit 102.

Referring to FIG. 7, an amplitude signal A and an exciting signal U(i) is put into said third shift register 108 through said k-stack 90 and said change-over switch 107, respectively, in a spare time period during the operation time of the circuit of FIG. 7, and are then subjected to multiplication AxU(i) in another spare time period during the operation time.

Figure 8A:
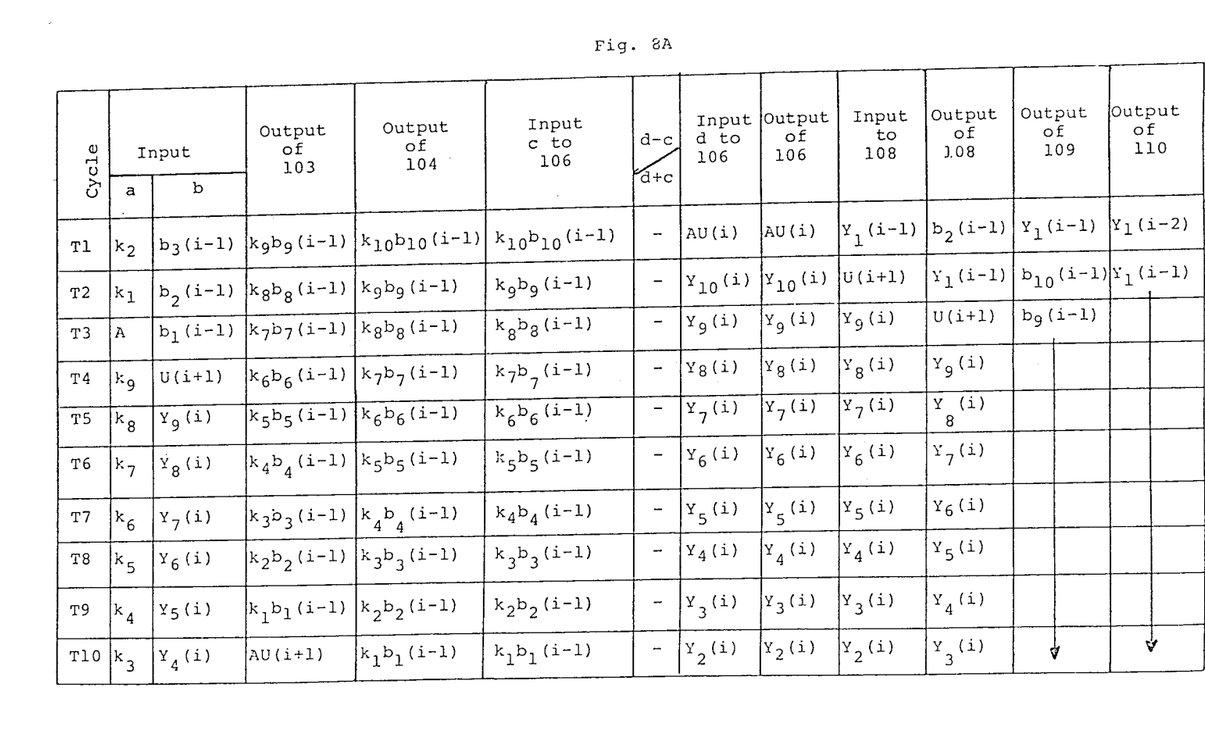

FIGS. 8A-8B show the timing diagram in the practical operation of the formulae shown in Table 1 by means of the circuits shown in FIG. 7. Referring to FIGS. 8A-8B, the information of the coefficient k is used as an input a for said one-step delay circuit 100 and the output from said third shift register 108 is used as an input b for said multiplication circuit 102 through said first shift register 101. The result of the multiplication appears in the form of the output from said second shift register 103 after six cycles through said multiplication circuit 102 and said second shift register 103.

Said first intermittently operating shift register 104 is in its shift-operation during the cycles $T_1$ to $T_{11}$ and interrupts the shift-operation during the cycles $T_{12}$ to $T_{20}$. The output from said first intermittently operating shift register 104 is used as the input c for said addition-subtraction circuit 106 during the cycles $T_{20}$ to $T_1$ and $T_1$ to $T_{10}$ and the output from said second shift register 103 is used as the input c for said addition-subtraction circuit 106 during the cycles $T_{11}$ to $T_{19}$. The output from said addition-subtraction circuit 106 is also used as the input d for said addition-subtraction circuit 106 during the cycles $T_1$ to $T_{10}$, the output from said second intermittently operating shift register 109 being used as the input d for said addition-subtraction circuit 106 during the cycles $T_{11}$ to $T_{19}$, and 0 being used as the input d for said addition-subtraction circuit during the cycle $T_{20}$. Said addition-subtraction circuit 106 carries out the subtraction operation in which the input c is subtracted from the input d during the cycles $T_1$ to $T_{10}$ and the addition operation in which the input c is added to the input d during the cycles $T_{11}$ to $T_{20}$.

The output from said second intermittently operating shift register 109, an exciting signal U(i+1) and the output from said addition-subtraction circuit 106 is used as the input for said third shift register 108, respectively. Said second intermittently operating shift register 109 is in its shift operation during the cycles $T_{11}$ to $T_{20}$ and $T_{20}$ to $T_2$ and interrupts the shift operation during the cycles $T_2$ to $T_{10}$. The contents of said latch circuit 110 is held during the cycles $T_2$ to $T_{20}$ and $T_{20}$ to $T_1$ and refreshed during the transition point from the cycle $T_1$ to the cycle $T_2$.

The above described construction of circuits makes it possible to carry out the operations shown in Table 1 by means of simple circuit-elements and said circuit-elements may be easily connected to each other.

Said one-step delay circuit 100 shown in FIG. 7 can encode the output signal from said k-stack 90 to put out the signal which is suitable for the multiplication algorithm of said multiplication circuit 102. It will be explained hereinafter why the addition of a one-step delay is required occasionally. One example is the design of an enode circuit by means of a four-phase dynamic ratioless shift register for the sake of power saving. The principle of forming a gate circuit by using four-phase dynamic ratioless shift register was described in detailed in the article entitled "MOS/LSI Design and Application" written by Dr. William N. Carr and Dr. Jack P. Mize (McGrawhill Book Company, 1972).

The attenuation operation may also be introduced. The insertion of a micro-loss in the synthesis filter may be taken as the countermeasure for limiting an unusual amplitude of synthetic voice. Its effect was described in detailed in the article entitled "The study of an analysis-synthesis method of PARCOR of deformed lattice type" (Material No. S77-06, Voice Study Meeting, The Acoustical Society of Japan, 1977, May).

FIG. 4a shows a model of a filter of a lattice type in which an attenuation operation is introduced.

Referring to FIG. 4a, the relationship between the signals $y_{10}$ to $y_1$, $b_{10}$ to $b_1$ and $b_{10}'$ to $b_1'$ are also represented by the formulae shown in Table 2.

Figure 9:
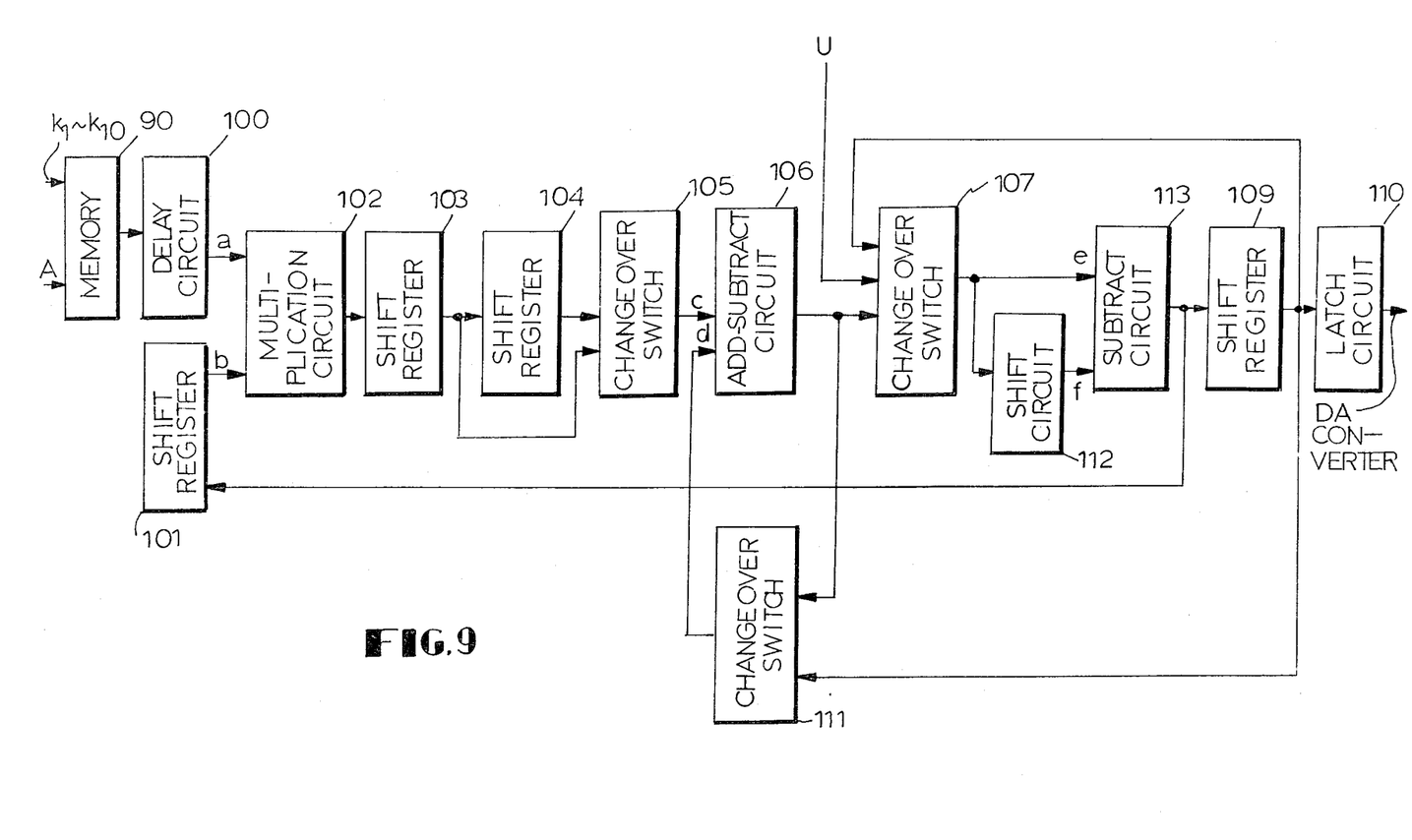
FIG. 9 is a block-diagram showing another example of the present invention as shown in FIG. 7 but additionally containing an attenuation term.

FIG. 9 shows another example of the present invention. It is the same as that shown in FIG. 7 except that shift circuit 112 and a subtraction circuit 113 are used instead of said third shift register 108 in FIG. 7. The output from said subtraction circuit 113 is the output from said change-over switch 107 times (1−1/256) if said shift circuit 112 is shifted to the right by eight bits. It is easy to adopt or except an attenuation operation because said shift circuit 112 and said subtraction circuit 113 are merely one-step shift registers if the output of said shift circuit 112 shown in FIG. 9 is 0.

Figure 10A:
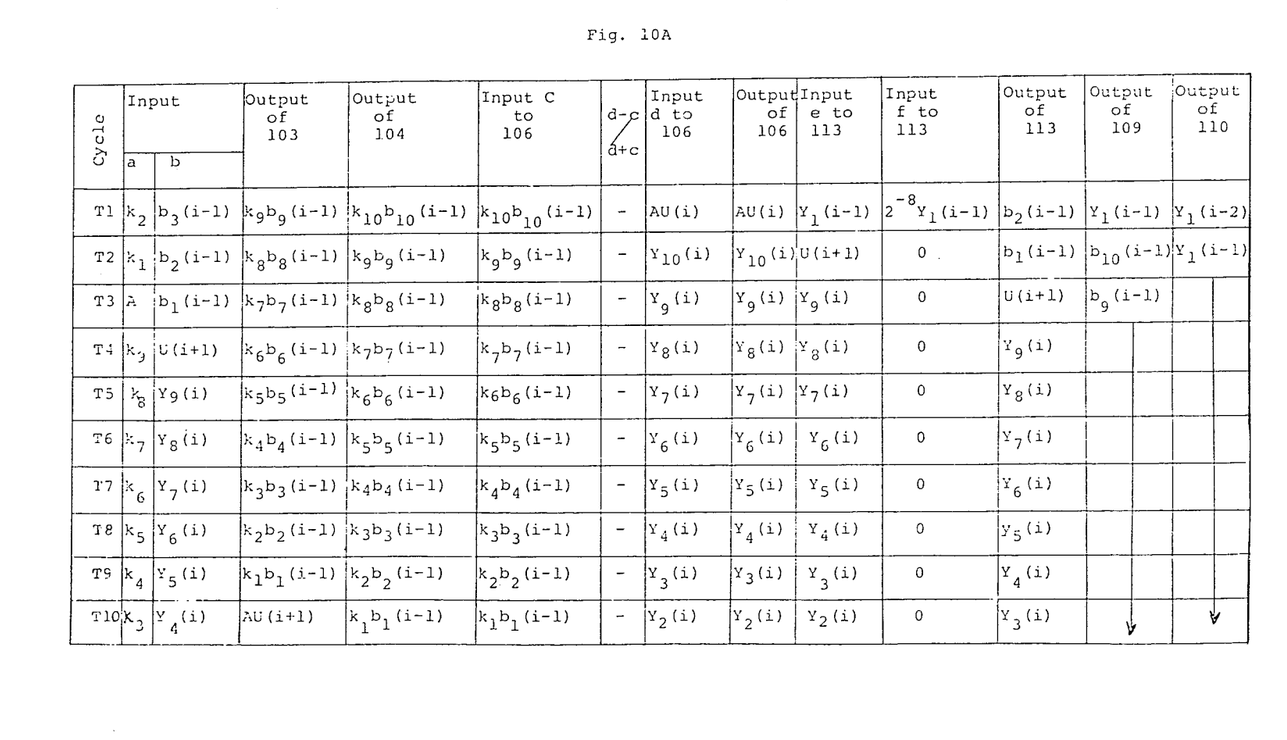
FIGS. 10A and 10B are a timing-diagram showing the operation of another example of the present invention as shown in FIG. 9.
Figure 10B:
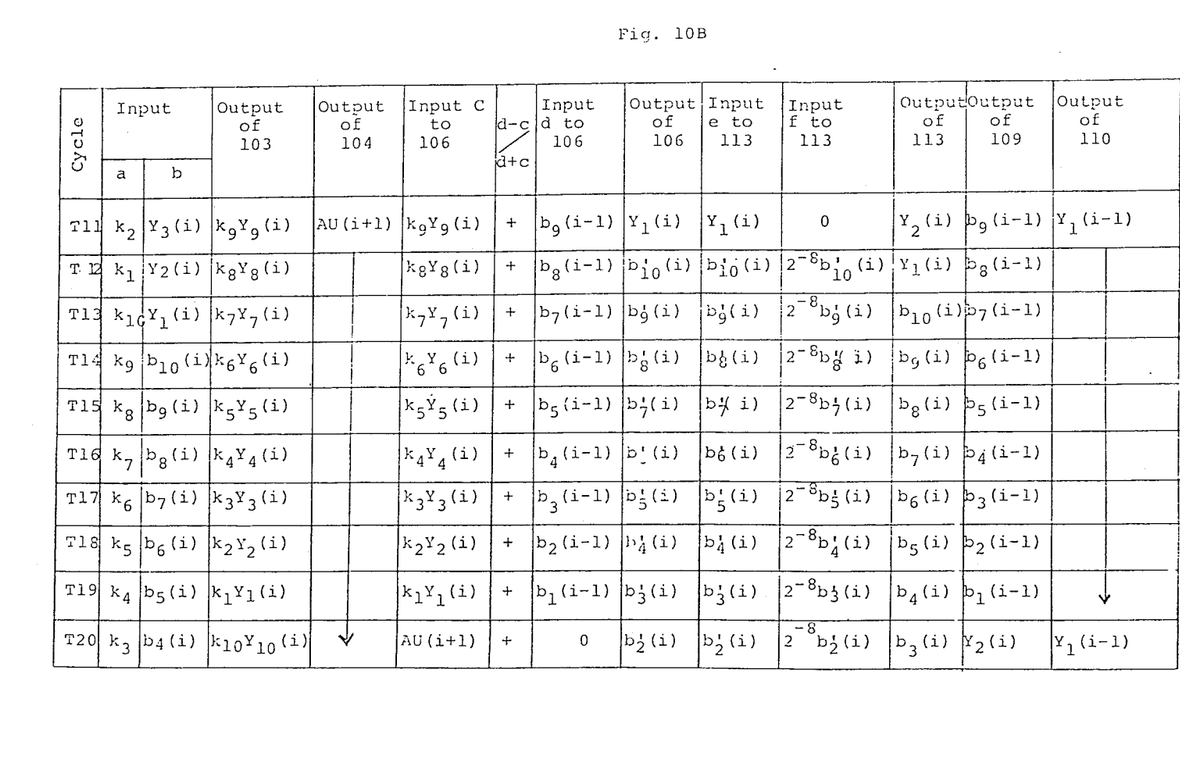

FIGS. 10A-10B show the timing diagram in the practical operation of the formulae shown in Table 2 by means of the construction shown in FIG. 9. FIGS. 10A-10B are the same as FIGS. 8A-8B except that the attenuation operation is carried out by means of the input and the output of said subtraction circuit 113.

Referring to FIG. 9, the construction in which a latch circuit 110 is connected with the output of said subtraction circuit 113 and $b_1(i-1)$ is put in said latch circuit 110 during the cycle $T_2$ may be used, too.

As shown above, the present invention can provide a digital filter which is remarkably simplified in construction and in which an attenuation term is easily introduced.

TABLE 1

$$y_{10}(i) = AU(i) - k_{10}b_{10}(i - 1)$$
$$y_9(i) = y_{10}(i) - k_9b_9(i - 1)$$
$$b_{10}(i) = b_9(i - 1) + k_9y_9(i)$$
$$y_8(i) = y_9(i) - k_8b_8(i - 1)$$
$$b_9(i) = b_8(i - 1) + k_8y_8(i)$$
$$y_7(i) = y_8(i) - k_7b_7(i - 1)$$
$$b_8(i) = b_7(i - 1) + k_7y_7(i)$$
$$y_6(i) = y_7(i) - k_6b_6(i - 1)$$
$$b_7(i) = b_6(i - 1) + k_6y_6(i)$$
$$y_5(i) = y_6(i) - k_5b_5(i - 1)$$
$$b_6(i) = b_5(i - 1) + k_5y_5(i)$$
$$y_4(i) = y_5(i) - k_4b_4(i - 1)$$
$$b_5(i) = b_4(i - 1) + k_4y_4(i)$$
$$y_3(i) = y_4(i) - k_3b_3(i - 1)$$
$$b_4(i) = b_3(i - 1) + k_3y_3(i)$$
$$y_2(i) = y_3(i) - k_2b_2(i - 1)$$
$$b_3(i) = b_2(i - 1) + k_2y_2(i)$$
$$y_1(i) = y_2(i) - k_1b_1(i - 1)$$
$$b_2(i) = b_1(i - 1) + k_1y_1(i)$$
$$b_1(i) = y_1(i)$$

TABLE 2

$$y_{10}(i) = AU(i) - k_{10}b_{10}(i - 1)$$
$$y_9(i) = y_{10}(i) - k_9b_9(i - 1)$$
$$b'_{10}(i) = b_9(i - 1) + k_9y_9(i)$$
$$b_{10}(i) = b'_{10}(i) - 2^{-8}b'_{10}(i)$$
$$y_8(i) = y_9(i) - k_8b_8(i - 1)$$
$$b'_9(i) = b_8(i - 1) + k_8y_8(i)$$
$$b_9(i) = b'_9(i) - 2^{-8}b'_9(i)$$
$$y_7(i) = y_8(i) - k_7b_7(i - 1)$$
$$b'_8(i) = b_7(i - 1) + k_7y_7(i)$$
$$b_8(i) = b'_8(i) - 2^{-8}b'_8(i)$$
$$y_6(i) = y_7(i) - k_6b_6(i - 1)$$
$$b'_7(i) = b_6(i - 1) + k_6y_6(i)$$
$$b_7(i) = b'_7(i) - 2^{-8}b'_7(i)$$
$$y_5(i) = y_6(i) - k_5b_5(i - 1)$$
$$b'_6(i) = b_5(i - 1) + k_5y_5(i)$$

TABLE 2-continued $$b_6(i) = b'_6(i) - 2^{-8}b'_6(i)$$
$$y_4(i) = y_5(i) - k_4b_4(i - 1)$$
$$b'_5(i) = b_4(i - 1) + k_4y_4(i)$$
$$b_5(i) = b'_5(i) - 2^{-8}b'_5(i)$$
$$y_3(i) = y_4(i) - k_3b_3(i - 1)$$
$$b'_4(i) = b_3(i - 1) + k_3y_3(i)$$
$$b_4(i) = b'_4(i) - 2^{-8}b'_4(i)$$
$$y_2(i) = y_3(i) - k_2b_2(i - 1)$$
$$b'_3(i) = b_2(i - 1) + k_2y_2(i)$$
$$b_3(i) = b'_3(i) - 2^{-8}b'_3(i)$$
$$y_1(i) = y_2(i) - k_1b_1(i - 1)$$
$$b'_2(i) = b_1(i - 1) + k_1y_1(i)$$
$$b_2(i) = b'_2(i) - 2^{-8}b'_2(i)$$
$$b'_1(i) = y_1(i)$$
$$b_1(i) = b'_1(i) - 2^{-8}b'_1(i)$$

What is claimed is:

1. A digital filter for responding to digital exciting signals and a plurality of digital values representing filter coefficients, comprising a memory means for storing a plurality of digital values representing filter coefficients, a multiplication circuit having a first input which is connected to an output from said memory means, a first delay circuit means which is connected to an output from said multiplication circuit, a first intermittently operating delay circuit means which is connected to an output from said first delay circuit means, a first change-over switch means for selectively changing over from either said output from said first delay circuit means or an output from said first intermittently operating delay circuit means, an addition-subtraction circuit having a first input which is connected to an output from said firsrt change-over switch means, a second delay circuit means which has an output which is connected to a second input of said multiplication circuit, a second intermittently operating delay circuit means which is connected to an output from said second delay circuit means, a second change-over switch means for selectively changing over from either an output of said addition-subtraction circuit or an output of said second intermittently operating delay circuit means and for outputting same as a second input for said addition-subtraction circuit, a third change-over switch for selectively changing over from either an output from said addition-subtraction circuit or an output from said second intermittently operating delay circuit means and for outputting same as an input for said second delay circuit means, and a latch means for temporarily storing a data output from said second intermittently operating delay circuit means.

2. A digital filter according to claim 1, wherein an exciting signal is additionally selectively input to said second delay circuit means by means of said third change-over switch means.

3. A digital filter according to claim 1, wherein said second delay circuit means comprises subtraction circuit in which an output from said third change-over switch means is directly connected to one input of said second delay circuit means and an output from said third change-over switch means is connected to another input of said second delay circuit means through a shift-circuit to form a subtraction circuit.

4. A digital filter for responding to digital exciting signals and a plurality of digital values representing filter coefficients, comprising a multiplication circuit provided with a first input terminal and a second input terminal, a second delay circuit means connected to an output of said multiplication circuit, a first intermittently operating delay circuit means connected to said second delay circuit means, a first change-over switch means for selectively changing over from either an output from said second delay circuit means or an output from said first intermittently operating delay circuit means, an addition-subtraction circuit having a first input which is connected to an output of said first change-over switch means, a third delay circuit means, a second intermittently operating delay circuit means connected to an output of said third delay circuit means, a latch-memory means for temporarily storing data output from said second intermittently operating delay circuit means, said first intermittently operated delay circuit means followed by said third delay circuit means and arranged so that its output is connected to a second input terminal of said multiplication circuit, a second change-over switch means supplying selectively either an output from said addition-subtraction circuit or an output from said second intermittently operating delay circuit means to a second input terminal of said addition-subtraction circuit, a third change-over switch means for selectively connecting either an output from said addition-subtraction circuit or an output from said second intermittently operating delay circuit means to said third delay circuit means, a one-step delay circuit means whose output is connected to a first input terminal of said multiplication circuit, and a memory means connected to said one-step delay circuit means for storing digital values representing filter coefficients.

5. A digital filter according to claim 4, wherein said third change-over switch means is arranged such that an exciting signal is selectively supplied to said third delay circuit means.

6. A digital filter according to claim 4, wherein said third delay circuit means comprises a subtraction circuit in which an output from said third change-over switch means is supplied to one input terminal thereof and an output from said third change-over switch means is supplied to another input terminal thereof through a shift-circuit.

* * * * *